Figure 1:
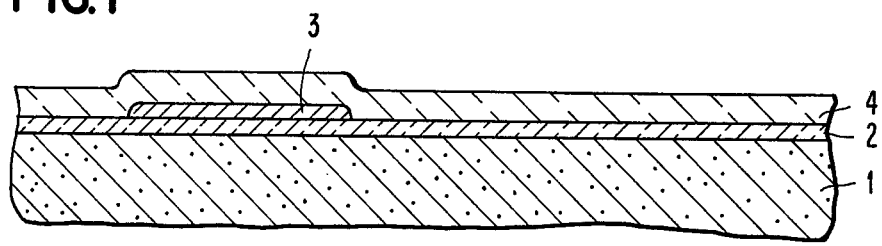

United States Patent [19]
Bährle et al.

[11] 4,152,195
[45] May 1, 1979

[54] METHOD OF IMPROVING THE ADHERENCE OF METALLIC CONDUCTIVE LINES ON POLYIMIDE LAYERS

[75] Inventors: Dieter Bährle, Schoenaich; Peter Frasch, Boeblingen; Wilfried König, Gaertringen; Friedrich Schwerdt; Ursula Thelen, both of Sindelfingen; Theodor Vogtmann, Holzgerlingen, all of Fed. Rep. of Germany

[73] Assignee: International Business Machines Corporation, Armonk, N.Y.

[21] Appl. No.: 825,626

[22] Filed: Aug. 18, 1977

[30] Foreign Application Priority Data

Aug. 27, 1976 [DE] Fed. Rep. of Germany ....... 2638799

[51] Int. Cl.² ................... B05D 3/02; B05D 1/38
[52] U.S. Cl. ................... 156/656; 156/634; 156/664; 156/665; 156/666; 427/96; 427/97; 427/99; 427/379; 427/380; 427/250

[58] Field of Search ........... 427/380, 379, 404, 407 R, 427/99, 96, 97, 250; 156/656, 665, 902, 901, 630, 633, 632, 634, 666, 664

[56] References Cited

U.S. PATENT DOCUMENTS

| 3,179,634 | 4/1965 | Edwards | 428/290 |
|---|---|---|---|
| 3,700,497 | 10/1972 | Epifano | 427/58 |
| 3,976,810 | 8/1976 | Hecht | 427/380 |

FOREIGN PATENT DOCUMENTS

51-73570  6/1976  Japan ....................... 427/404

*Primary Examiner*—Michael F. Esposito
*Attorney, Agent, or Firm*—Wolmar J. Stoffel

[57] ABSTRACT

A method of improving the adherence of conductive metallic lines to a polyimide resin layer by incompletely curing the polyimide resin prior to deposition of the metal layer, and subsequently completely curing the polyimide resin layer after the metal layer is deposited.

7 Claims, 4 Drawing Figures

METHOD OF IMPROVING THE ADHERENCE OF METALLIC CONDUCTIVE LINES ON POLYIMIDE LAYERS

BACKGROUND OF THE INVENTION

The invention relates to a method of improving the adherence of metallic conductive lines on polyimide layers in integrated circuits.

In the production of integrated circuits cover layers are frequently used which have openings for different purposes. The cover layers are provided to protect the pn junctions of integrated circuits against outside influence, and can consist of either inorganic or of organic insulating material. Examples of inorganic insulation materials for making cover layers are $SiO_2$, $Al_2O_3$, amorphous silicon, and $Si_3N_4$. It is, for instance, known to provide in integrated semiconductor components a glass layer as cover layer over an underlying passivation layer of $SiO_2$, and a conductive line pattern on the $SiO_2$ layer which serves as electrical circuit connection. For making external connections to the conductive line pattern, openings are etched into this glass layer. The disadvantage of these glass layers is that their application is very complex. Furthermore, these layers may be difficult to to etch. Examples of some insulation materials for forming cover layers are polyimides as set forth in GE-AS 1 764 977, GE-OS 1 955 730, polyhydantoins as set forth in 2 322 347 and GE-OS 2 537 330, and a photoresist that is metal-free and cured by heat treatment, as set forth in GE-OS 2 401 613.

It is also known to use in double layer metallization systems, materials of the above named type for making the insulating intermediate layers. For example, a quartz layer was deposited by means of cathode sputtering metallization pattern of a double layer metallization, and after the via holes had been made a metal film was deposited thereon for making the second metallization pattern. A disadvantage of intermediate layers of inorganic materials is, as mentioned above already, that their application is quite complex and that they are highly sensitive to mechanical stress.

Insulating intermediate layers of organic material, for instance of polyimide resin, are much less complicated in their application than quartz layers. These layers also have a much higher layer perfection than that of insulating quartz layers. It is taught in U.S. Pat. No. 3,179,634 that layers of polyamido carboxylic acid adhere better to aluminum substrates after having been dried at 120° C. during a period of 15 minutes, but it has been found that in the etching of metallization patterns in aluminum films vapor-deposited on polyimide substrates that these patterns lift off from the substrate and coil themselves up. Metal films of chromium, copper, gold vapor-deposited on the entire surface show better adherence on the polyimide substrate than those of aluminum, but they have the disadvantage that they corrode and have poor etching properties.

Efforts have been made to improve the adherence of the aluminum layers vapor-deposited on the entire surface of the polyimide substrate. The surface of the polyimide substrate was roughened by means of cathode sputtering so that a satisfactory and sufficient adherence of the aluminum is achieved. There is however the disadvantage that in this process a conductive layer is generated in the polyimide surface which causes very high surface leakage currents. A roughening of the polyimide surface using an alkaline metasilicate solution, a 2.5 percent by weight aqueous tetramethylammonium hydroxide solution, Caro's acid, or N-methylpyrrolidone did not bring success as the surface attack was highly irregular and unreproducible. Another means of roughening the surface consisted of placing the polyimide substrate into an oxygen atmosphere and generate electrical discharges which partly burn the surface. This process can achieve a roughening of the surface of the polyimide substrate. An obstacle to its application is that it is an additional process step. Also there is the risk of introducing electrical charges which would the electrical properties of integrated circuits.

SUMMARY OF THE INVENTION

It is therefore the object of the invention to provide a method of improving the adherence of metal films vapor-deposited on a surface, more specifically of conductive lines on polyimide layers, where without additional process steps excellent adherence of the conductive lines on the substrate can be achieved.

The object of the invention is achieved by a process which is characterized in that the curing of the polyamidocarboxylic acid layer into polyimide is performed in a first step before, and in a second step after the vapor-deposition of the metal film on the entire surface, and that subsequently the conductive line pattern is etched into this film in a known manner.

In an advantageous embodiment of the invention the polyamidocarboxylic acid layer, prior to the vapor deposition of the metal film, is partially cured by heating it to approximately 200° C. and 275° C. for 20 and 30 minutes respectively, and after the vapor deposition of the metal film the polyamidocarboxylic layer is fully cured into polyimide resin by heating it to approximately 350° C. for approximately 20 minutes.

Details of the invention are given in the following specification in connection with the figures of an embodiment of the invention.

The figures show:

FIG. 1 a cross section through part of an integrated circuit, and

Figure 2:
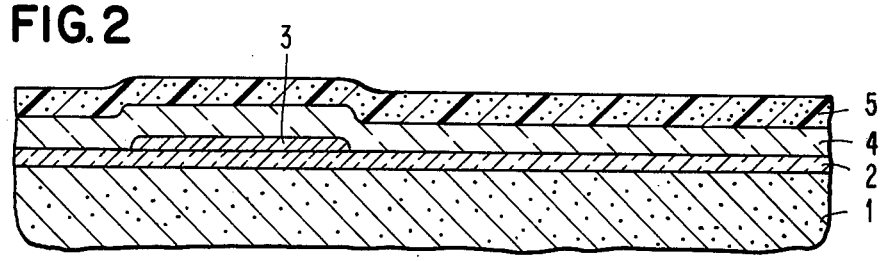
Figure 3:
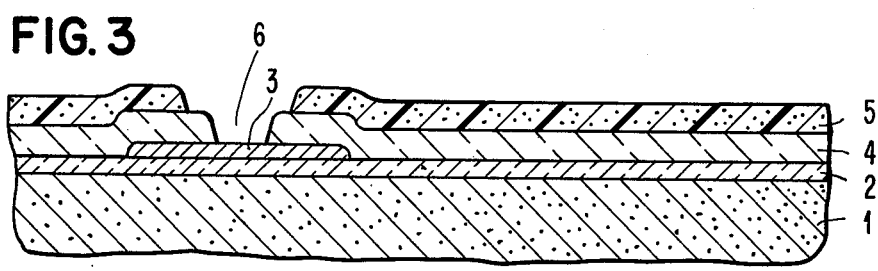
Figure 4:
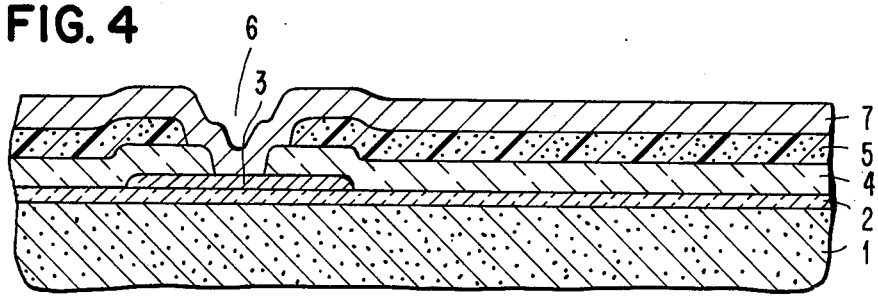

FIGS. 2 to 4 corresponding sections during subsequent process steps.

The invention is specified by means of a process for making metallization patterns for connecting components of an integrated circuit. It is however also applicable to other fields of use.

FIG. 1 shows in a cross-section part of a typical integrated circuit monolithically structured in a silicon wafer, with a substrate 1 of monocrystalline silicon of low p-conductance. In the surface of substrate 1 some circuit elements (not shown in the drawing) are provided for instance, through the diffusion of n-conductive doping substances. The circuit elements and parts of the surface of substrate 1 are coated with one or several layers of an inorganic material, e.g., with layers of silicon dioxide and silicon nitride, which in a known manner are grown or deposited on substrate 1. In these layers which in FIG. 1 are assembled in a layer 2 via holes (not shown) to the active and passive components in substrate 1 are arranged.

The circuit contains electrical connections to the circuit elements which are made by means of the vapor deposition of aluminum on the surface of layer 2, the forming of a conductive line pattern through a photolithographic process, and through the via holes in layer 2. In FIG. 1, one of these connections 3 extends over part of layer 2 and through a via hole in layer 2 (not shown) to an active or passive component in substrate 1.

After the first metallization pattern 3 has been made the surface of the entire integrated circuit is covered with an approximately 1.6 μm thick quartz layer 4 that is applied by means of cathode sputtering. Prior to the application of the polyamidocarboxylic acid layer 5 (FIG. 2) a 0.1 percent by weight solution of a silane in water, e.g., of ν-aminopropyltriethoxysilane in water is applied by spin coating. Subsequently, a solution of a polyamidocarboxylic acid of pyromellitic acid anhydride and 4,4'-diaminodiphenyl ether which is commercially available e.g., from DuPont under the designation Pyre-M.L. RC 5057, in a solvent mixture containing as main component N-methyl-2-pyrrolidone or dimethylacetamide, is applied by spraying or spin coating. The solution of the uncured resin in the solvent mixture contains between 10 and 20 percent by weight resin. The layer can have a wet layer thickness between 18,000 and 22,000 Å. The thickness of the thus applied layer largely depends on the concentration of the resin solution and on the number of revolutions for the spin coating. During a dry period of 30 minutes at 120° C. approximately which can be carried out by means of heating on a hot plate a large part of the solvent is removed from the polyamidocarboxylic acid layer. Then, in a known manner, a layer of a positive resist, e.g., AZ 1350 J of Shipley Company, Inc. which contains a polymer sensitizer compound of an m-cresol formaldehyde resin and a 5-substituted diazonaphthoquinone is applied on the polyamidocarboxylic acid layer, dried, and exposed imagewise in accordance with the respective pattern of openings 6 (FIG. 3). The exposed areas of the photoresist layer and the areas of polyamidocarboxylic acid layer 5 therebeneath are removed simultaneously with an alkaline developer, e.g., with diluted aqueous potassium hydroxide solution. Subsequently, the unexposed areas of the photoresist layer are removed therefrom with a solvent not attacking the still uncured polyamidocarboxylic acid 5, e.g., with butylacetate/isopropanol. After the removal of the photoresist the polyamidocarboxylic acid layer 5 is rinsed with a 0.5% aqueous acetic acid in order to exchange again against hydrogen ions the potassium ions absorbed at the pattern edges of the polyamidocarboxylic acid.

After a first curing of approximately 30 minutes of the polyamidocarboxylic acid layer 5 at about 200° C., which can be done by heating on a hot plate, the via holes are opened by means of a photolithographic process in the areas of quartz layer 4 (FIG. 3) that are beneath openings 6 of polyamidocarboxylic acid layer 5. After the removal of the photoresist layer which has been used in this photolithographic process, and after a rinsing, the wafers are heated on a hot plate for about 20 minutes to 275° C. for a second curing of the polyamidocarboxylic acid layer 5. In this second curing which is carried out below the actual curing temperature of the polyimide of 350° C., all solvent residues are removed from the layer and the polymer which for each carbonamide group formed still contains one free carboxyl group begins to convert into the polyimide, splitting off water in the process. The second curing at 275° C. is carried out in order to improve the adherence of the subsequently to be vapor-deposited film 7 (FIG. 4) of aluminum or an aluminum-copper alloy on the polyimide layer, for tests have shown that when the polyimide had been fully cured already before the vapor-deposition of aluminum film 7 the aluminum lifted off from the polyimide substrate already during the etching of the second metallization pattern.

After the second curing the bared surface of quartz layer 4 is cleaned in a known manner with an aqueous solution of ammonium fluoride and ammonium dihydrogen phosphate. There follows the vapor-deposition of an approximate 2.0 μm film 7 of aluminum or an aluminum-copper alloy in a vacuum vapor deposition apparatus. As soon as this vapor deposition on the entire surface has been concluded the polyimide is fully cured by means of heating the coated wafers in a diffusion oven to 350° C. for a period of approximately 20 minutes, and at the same time the film of aluminum or aluminum-copper is annealed. In this third and last curing the vapor-deposited aluminum 7 reacts with polyimide 5 (FIG. 4) and results in an excellent adherence.

Subsequently the second metallization pattern is etched in a known manner by means of a photolithographic process. For passivating the second metallization a second polyamidocarboxylic acid layer is applied. After the openings in the respective areas of this layer have formed, and after a curing at 200° C. and another at 350° C. the soldering connections to the module are prepared.

For checking the adherence of the second metallization 7 on the first polyimide layer 5 a so called adhesive tape test is performed. In this test, a self-adhesive tape (Tesa tape, Scotch tape) is transversally applied over the wafer and pressed down firmly. The wafer is clamped down at the edges by means of two plates. Then the tape is jerked off in an upward direction. Particles of the metallization pattern that adhered insufficiently to the polyimide stick to the adhesive tape and are clearly visible. Quantitative measurings have shown that adherence strengths of the aluminum metallization pattern of up to 11.9 g/mm stripe width can be reached. Highly reproducible values are in the order of about 9.5 g/mm stripe width, adherence strengths of less than 5.96 g/mm stripe width being useless.

We claim:

1. A method of fabricating a metal layer having improved adhesion on a polyimide resin surface layer comprising:

depositing a layer of polyamidocarboxylic acid on a substrate partially curing said layer of polyamidocarboxylic acid vapor depositing a blanket layer of metal on the resultant partially cured layer, fully curing said partially cured layer to form polyimide by heating to approximately 350° C. for a period of twenty minutes, and etching a conductive line pattern in said layer of metal.

2. The method of claim 1 wherein the polyamicocarboxylic acid layer prior to the vapor deposition of the metal film is partially cured by heating it to approximately 200° C. and 275° C. during a period of 20 to 30 minutes, respectively.

3. The method of claim 1 wherein said polycarboxylic acid layer is formed by reacting a polymer of pyromellitic acid anhydride and 4,4'-diaminodiphenyl ether.

4. The method of claim 1 wherein said layer of metal is an aluminum or an aluminum-copper alloy vapor-deposited as a metal film on the entire surface of said polyamidocarboxylic acid layer.

5. The method of claim 1 wherein said layer of polyamidocarboxylic acid, prior to curing has a thickness in the range of 18,000 to 22,000 angstroms.

6. The method of claim 1 wherein said substrate is initially provided with a surface quartz layer.

7. The method of claim 6 wherein prior to the partial curing of the polyamidocarboxylic acid layer, openings are made in respective areas thereof, and that after said partial curing via holes are made in said quartz layer therebeneath, and that subsequently the metal layer is vapor-deposited on the entire surface.

* * * * *